(12) United States Patent
Pigott et al.

(10) Patent No.: US 9,385,190 B2
(45) Date of Patent: Jul. 5, 2016

(54) DEEP TRENCH ISOLATION STRUCTURE LAYOUT AND METHOD OF FORMING

(71) Applicant: Freescale Semiconductor, Inc., Austin, TX (US)

(72) Inventors: John M. Pigott, Phoenix, AZ (US); Brent D. Rogers, Gilbert, AZ (US); Randall C. Gray, Tempe, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 42 days.

(21) Appl. No.: 14/196,278

(22) Filed: Mar. 4, 2014

(65) Prior Publication Data

US 2015/0255537 A1 Sep. 10, 2015

(51) Int. Cl.
| H01L 29/06 | (2006.01) |
| H01L 23/525 | (2006.01) |
| H01L 27/06 | (2006.01) |
| H01L 21/762 | (2006.01) |
| H01L 27/02 | (2006.01) |

(52) U.S. Cl.
CPC ...... *H01L 29/0649* (2013.01); *H01L 21/76224* (2013.01); *H01L 23/5252* (2013.01); *H01L 27/0207* (2013.01); *H01L 27/0676* (2013.01)

(58) Field of Classification Search
None
See application file for complete search history.

(56) References Cited

U.S. PATENT DOCUMENTS

| 4,980,747 | A | 12/1990 | Hutter et al. |
| 5,486,776 | A | 1/1996 | Chiang |
| 6,333,667 | B2 | 12/2001 | Lee |
| 7,608,908 | B1 | 10/2009 | Khemka et al. |
| 2002/0149084 | A1* | 10/2002 | Tamaki et al. ............... 257/517 |
| 2008/0017912 | A1 | 1/2008 | Kumar et al. |
| 2011/0049668 | A1 | 3/2011 | Lin et al. |
| 2012/0007207 | A1* | 1/2012 | Salcedo ............ H01L 27/0259 257/491 |
| 2012/0043583 | A1* | 2/2012 | Abou-Khalil ....... H01L 27/0262 257/157 |

OTHER PUBLICATIONS

Kitahara et al., "A Deep Trench Isolation integrated in a 0.13um BiCD process technology for analog power ICs," IEEE BCTM 13.2, pp. 206-209, 2008 (4 pages).

Ng et al., "Diode Based Gate Oxide Anti-fuse One Time Programmable Memory Array in Standard CMOS Process," IEEE, pp. 457-460, 2009 (4 pages).

(Continued)

*Primary Examiner* — Mohammad Islam
*Assistant Examiner* — Mikka Liu

(57) ABSTRACT

The embodiments described herein provide a semiconductor device layout and method that can be utilized in a wide variety of semiconductor devices. In one embodiment a semiconductor device is provided that includes a plurality of deep trench isolation structures that define and surround a first plurality of first trench-isolated regions in the substrate, and further define a second plurality of second trench-isolated regions in the substrate. The first plurality of first trench-isolated regions is arranged in a plurality of first columns, with each of the first columns including at least two of the first plurality of first trench-isolated regions. Likewise, the plurality of first columns are interleaved with the second trench-isolated regions to alternate in an array such that a second trench-isolated region is between consecutive first columns in the array and such that at least two first trench-isolated regions are between consecutive second trench-isolated regions in the array.

17 Claims, 6 Drawing Sheets

(56) References Cited

OTHER PUBLICATIONS

He et al., "A Compact CMOS Compatible Oxide Antifuse With Polysilicon Diode Driver," IEEE Transactions on Electron Devices, vol. 59, No. 9, pp. 2539-2541, Sep. 2012 (3 pages).

Parthasarathy et al., "A 0.25um CMOS based 70V smart power technology with deep trench for high-voltage isolation," Semiconductor Products Sector, Motorola Inc. (4 pages).

\* cited by examiner

DEEP TRENCH ISOLATION STRUCTURE LAYOUT AND METHOD OF FORMING

TECHNICAL FIELD

Embodiments described herein generally relate to semiconductor integrated circuit technology, and more particularly to semiconductor devices that use deep trench isolation structures.

BACKGROUND

Isolation structures are used in a variety of semiconductor devices to electrically isolate devices formed on a semiconductor substrate. Examples of isolation structures include both shallow trench isolation (STI) and deep trench isolation (DTI). In general, shallow trench isolation utilizes relatively shallow trenches filled with a dielectric material. Shallow trench isolation is commonly used to reduce parasitic capacitances and provide a relatively low level of voltage isolation between integrated devices. Conversely, deep trench isolation utilizes relatively deep trenches. For example, the trenches for deep trench isolation can extend to a buried insulator layer (e.g., BOX layer) in a silicon-on-insulator (SOI) substrate. In deep trench isolation, the trenches may be filled with a dielectric material, such as silicon dioxide, and in some cases additional materials, such as polysilicon. Deep trench isolation can provide relatively high voltage isolation between devices compared to shallow trench isolation. As such, deep trench isolation can be used to provide galvanic isolation between integrated devices on a semiconductor substrate. As such, deep trench isolation can be used to provide isolation between integrated devices that operate at different voltages levels and prevent undesirable interactions between distinct devices.

One issue with deep trench isolation is that in order to remain highly effective deep trench isolation needs to be implemented with one or more design rules. For example, allowing a "cross shape" of deep trench isolation has been shown to potentially reduce the manufacturability of the structure and therefore can reduce the yield, or percentage of acceptable structures in a design.

FIG. 6 illustrates an example of such cross-shape structures. FIG. 6 is a top view of a portion of semiconductor substrate 600. Formed in the semiconductor substrate 600 is a portion of deep trench isolation structure 602. The layout of the deep trench isolation structure 602 is such that it includes four cross-shaped intersections (e.g., cross shape 604). Cross shapes can occur anywhere four deep isolation trenches meet, typically at right angles.

Several manufacturability issues are related to cross shapes in deep trench isolation. As one example of manufacturability issues related to cross shapes, such cross shapes in the deep trench isolation structure can result in voids being formed in the dielectric material of the deep trench. In some cases, such voids can allow contamination to accumulate in the deep trench isolation structure, which can be transferred to subsequent manufacturing steps and degrade the effectiveness of the deep trench isolation structure.

There thus is a continuing need to improve the reliability of isolation structures, particularly deep trench isolation used in high voltage applications, and to have efficient layout techniques that accommodate the rule restrictions without using excessive additional area.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein provide a semiconductor device layout and method that can be utilized in a wide variety of semiconductor devices. In one embodiment, a semiconductor device is provided that includes a semiconductor substrate and a plurality of deep trench isolation structures formed in the semiconductor substrate. The layout of the plurality of deep trench isolation structures is such that the deep trench isolation structures define and surround a first plurality of first trench-isolated regions in the substrate, and further define and surround a second plurality of second trench-isolated regions in the substrate. Each of the first plurality of first trench-isolated regions have a first dimension and each of the second plurality of second trench-isolated regions have a corresponding second dimension, and the second dimension is at least twice the first dimension. The first plurality of first trench-isolated regions is arranged in a plurality of first columns, with each of the first columns including at least two of the first plurality of first trench-isolated regions. Likewise, the plurality of first columns are interleaved with the second trench-isolated regions to alternate in an array such that a second trench-isolated region is between consecutive first columns in the array and such that at least two first trench-isolated regions are between consecutive second trench-isolated regions in the array. So arranged, the deep trench isolation structures can provide reliable isolation for devices formed within the defined trench-isolated regions. Specifically, the deep trench isolation structures so formed may avoid the formation of "cross shape" that has been shown to potentially reduce the manufacturability of the structure.

It should be noted that for purposes of this application that the term "columns" can refer arrangements of trench-isolated regions in any direction or orientation. Thus, there is no requirement that the first columns of first trench-isolated regions be in any particular orientation with respect to any other elements in the semiconductor device. Likewise, the term "trench-isolated region" refers to a portion of the semiconductor substrate surrounded and electrically isolated by the deep trench isolation structures. Such trench-isolated regions are sometimes referred to as "islands" and provide an area in which one or more integrated devices can be formed and electrically isolated from other devices in other trench-isolated regions. Finally, for this application the term "semiconductor substrate" can include any type of semiconductor device substrate, and thus can include both bulk semiconductor material and multilayered semiconductor substrates. For example, the semiconductor substrate can include a base silicon substrate, a buried dielectric layer, and an epitaxial silicon layer over the buried dielectric layer as is commonly used in silicon-on-insulator (SOI) technologies.

Figure 1:
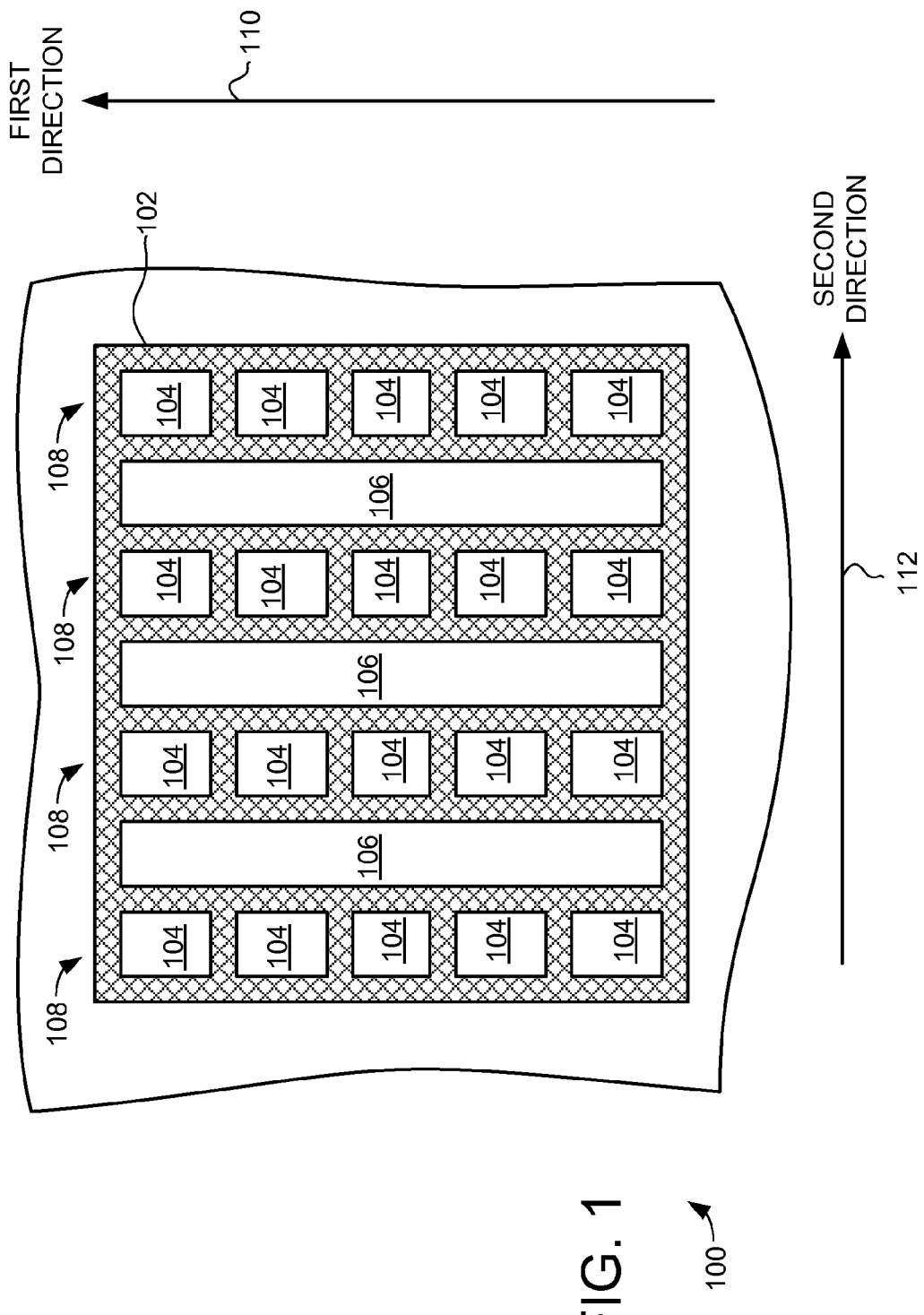
FIG. 1 is a top view of a portion of semiconductor substrate with deep trench isolation structures in accordance with an example embodiment.

Turning now to FIG. 1, a top view of a portion of semiconductor substrate 100 is illustrated. Formed in the semiconductor substrate 100 are deep trench isolation structures 102. The deep trench isolation structures 102 are exemplary of the type of structures that can be formed and utilized to isolate semiconductor devices in trench-isolated regions on the substrate 100. Specifically, FIG. 1 illustrates an example where the layout of the plurality of deep trench isolation structures 102 is such that the deep trench isolation structures 102 define and surround a first plurality of first trench-isolated regions 104, and further define a second plurality of second trench-isolated regions 106. The first plurality of first trench-isolated regions 104 is arranged in a plurality of first columns 108, with each of the first columns 108 including at least two of the first plurality of first trench-isolated regions 104 arranged along a first direction. In the illustrated embodiment the first direction is illustrated by line 110.

The plurality of first columns 108 are interleaved with the second trench-isolated regions 106 to alternate in an array such that a second trench-isolated region 106 is between consecutive first columns 108 in the array. Specifically, the plurality of first columns 108 and the second trench-isolated regions 106 are interleaved along a second direction, with the second direction illustrated by line 112. In this illustrated example the second direction is perpendicular to the first direction.

Furthermore, at least two first trench-isolated regions 104 are between consecutive second trench-isolated regions 106 in the array. This arrangement is facilitated by the relative dimensions of the first trench-isolated regions 104 and the second trench-isolated regions 106. Specifically, the second trench-isolated regions 106 have at least one dimension along the first direction that is at least twice a corresponding dimension of first trench-isolated regions 104 along the same first direction. In this illustrated embodiment the second trench-isolated regions 104 are at least twice as tall as the adjacent first trench-isolated regions 104.

Because each of the first columns 108 include at least two of the first plurality of first trench-isolated regions 104 arranged along a first direction, and because the second trench-isolated regions 106 have a dimension along that first direction that is at least twice the corresponding dimension of the first trench-isolated regions 104 along that same first direction, when a second trench-isolated region 106 is arranged adjacent to a column 108 of the first trench-isolated regions 104 each second trench-isolated region 106 spans multiple first trench-isolated regions 104. Such an arrangement can provide reliable isolation for devices formed within the defined trench-isolated regions 104 and 106. Specifically, the deep trench isolation structure 102 avoids the formation of cross shapes in the structure 102 that may otherwise reduce the manufacturability of the isolation provided by the deep trench isolation. Thus, the deep trench isolation structure 102 can provide reliable isolation between devices formed in the various trench-isolated regions 104 and 106. As such, the structure 102 and similar such structures can be used in a wide variety of applications that require effective isolation between devices.

It should be noted that the structure 102 is just one example implementation. For example, in other embodiments a plurality of second trench-isolated regions 106 are formed between consecutive first columns 108. In such an example a first column 108 can be adjacent to two second trench-isolated regions 106 that are adjacent each other. Thus, in this arrangement the structure 102 could have two second trench-isolated regions 106 that are side-by-side and between two first columns 108.

It should also be noted, that the structure 102 is a simplified example, and that in many cases such deep trench isolation structures 102 may be considerably larger and more complex. For example, when used as part of a large regular antifuse array, the deep trench isolation structure 102 may define considerably larger numbers of rows and columns of trench-isolated regions corresponding to the rows and columns in the antifuse array.

It should be also noted that for the structure 102 to be used most effectively the semiconductor devices integrated onto the substrate should include both devices that are to be isolated individually or in small numbers with devices that can be isolated together in relatively large numbers. Thus, the relatively small first trench-isolated regions 104 can be formed to include isolated devices or with relatively small numbers of other devices. Conversely, the relatively large second trench-isolated regions 106 can be formed to include larger number of devices. Again, a specific example where the trench-isolated regions 104 and 106 are formed to include the elements of antifuse array will be discussed in greater detail below.

Figure 2:
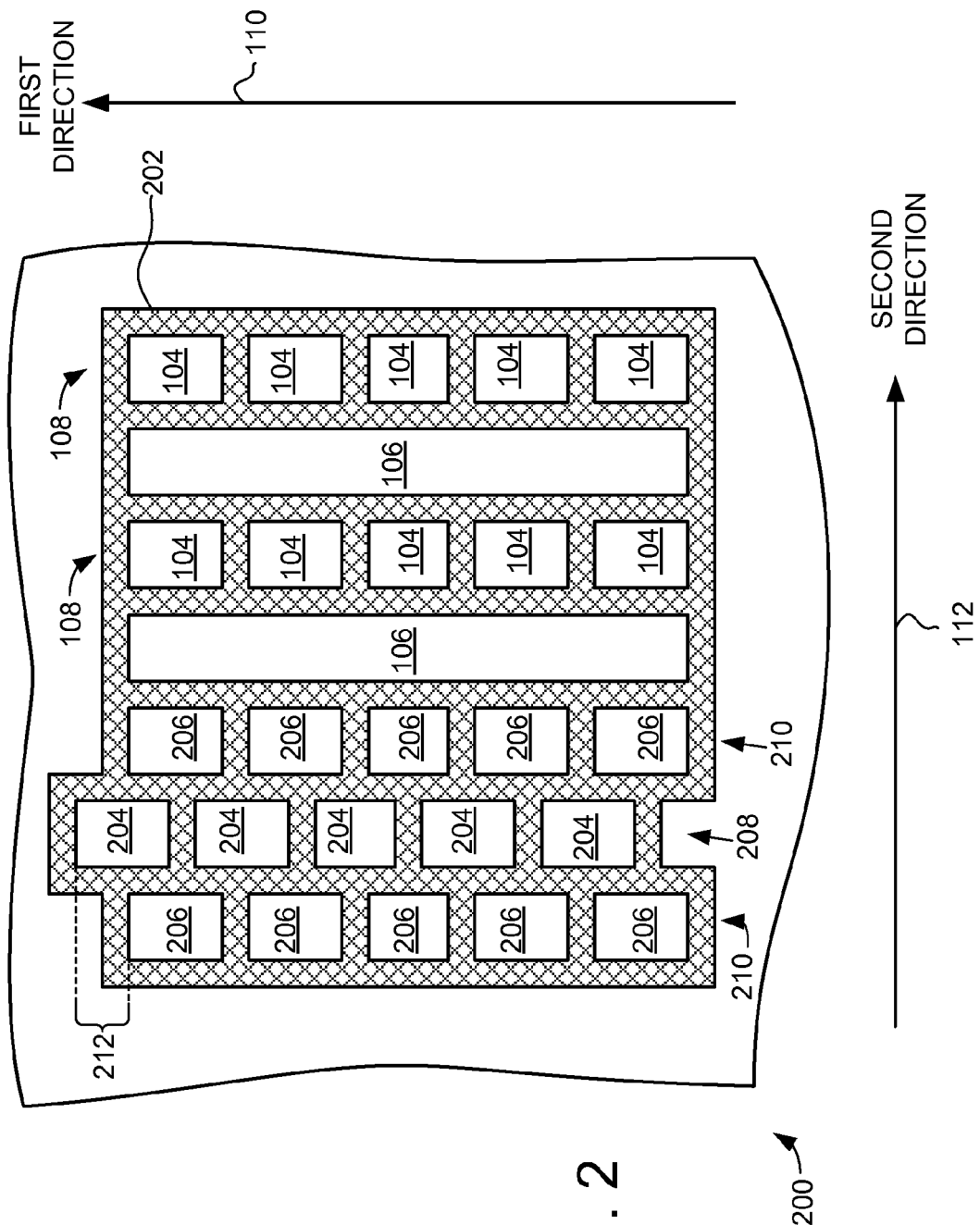
FIG. 2 is a top view of a portion of semiconductor substrate with deep trench isolation structures in accordance with an example embodiment.

In some embodiments, it may be desirable to include larger numbers of relatively small trench-isolated regions. In such cases it may not be feasible to exclusively alternate between first columns 108 of first trench-isolated regions 104 and the second trench-isolated regions 106. Turning now to FIG. 2, a top view of a portion of a second embodiment semiconductor substrate 200 is illustrated. Again, formed in the semiconductor substrate 200 is a portion of deep trench isolation structures 202. Again, the deep trench isolation structures 202 are exemplary of the type of structures that can be formed and utilized to isolate semiconductor devices.

In the embodiment illustrated in FIG. 2, the deep trench isolation structures 202 again define and surround a first plurality of first trench-isolated regions 104, and further define a second plurality of second trench-isolated regions 106. The first plurality of first trench-isolated regions 104 is again arranged in a plurality of first columns 108, with each of the first columns 108 including at least two of the first plurality of first trench-isolated regions 104. In this second embodiment, however, the deep trench isolation structures 202 additionally define and surround a third plurality of third trench-isolated regions 204 and a fourth plurality of fourth trench-isolated regions 206. The third plurality of third trench-isolated regions 204 are arranged in a column 208 between columns 210 of the fourth plurality of fourth trench-isolated regions 206. Furthermore, the third plurality of third trench-isolated regions 204 are offset in position such that the third plurality of third trench-isolated regions 204 are offset from the fourth plurality of fourth trench-isolated regions 206 by an offset distance 212. In this illustrated example, the third plurality of third trench-isolated regions 204 are offset along the first direction, where again the first direction is indicated by line 110.

This offsetting of the third trench-isolated regions 204 from the fourth trench-isolated regions 206 again serves to avoid the formation of cross shapes in the deep trench isolation structures 202 that have been shown to potentially reduce the manufacturability of the isolation. In most cases, the offsetting of the trench-isolated regions would be done to at least a minimum offset distance, where the minimum offset distance is the determined amount of offset required to avoid unacceptable reductions in isolation effectiveness. Such a minimum offset distance would thus be dependent upon the specific technologies used to form the deep trench isolation structures 202 and the isolation requirements of the integrated devices formed in the trench-isolated regions 204 and 206. For example, a typical high voltage SOI technology may have a minimum offset distance of between 2.5 and 2.9 microns between centers.

As can be seen in FIG. 2, this second embodiment can provide a greater number of trench-isolated regions in a given area, and thus the use of offset trench-isolated regions may be desirable in those cases where additional isolation regions are needed. One example of such a layout will be discussed in greater detail below.

Figure 3:
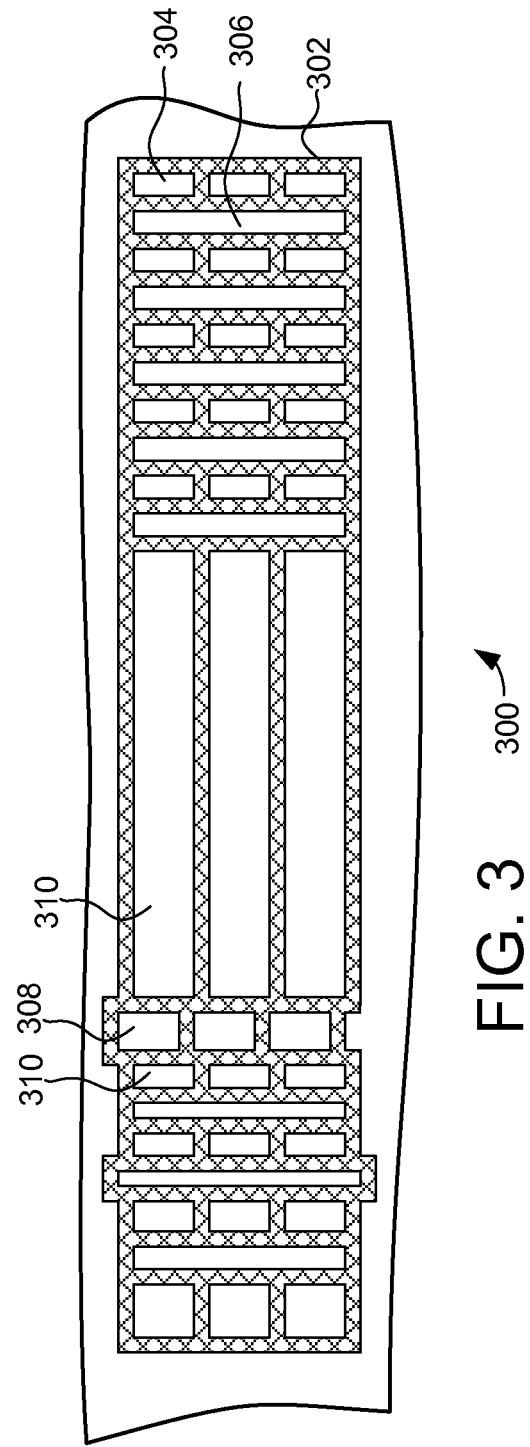
FIG. 3 is a top view of a portion of semiconductor substrate with deep trench isolation structures in accordance with an example embodiment.

Turning now to FIG. 3, a top view of a portion of a third embodiment semiconductor substrate 300 is illustrated. Formed in the semiconductor substrate 300 are deep trench isolation structures 302. The deep trench isolation structures 302 are exemplary of the type of structures that can be formed and utilized to isolate semiconductor devices. In the embodiment illustrated in FIG. 3, the deep trench isolation structures 302 define and surround first trench-isolated regions 304, second trench-isolated regions 306, third trench-isolated regions 308 and fourth trench-isolated regions 310. The deep trench isolation structures 302 are configured to avoid the formation of "cross shapes" that has been shown to potentially reduce the effectiveness of the isolation provided by the structure 202. As with the embodiment in shown in FIG. 2, this is done by arranging the first trench-isolated regions 304 into columns that alternate with the larger second trench-isolated regions 306, and offsetting the position of the third trench-isolated regions 308 relative to the position of the fourth trench-isolated regions 310. In this case, it should be noted that the fourth trench-isolated regions 310 are effectively wider versions of the first trench-isolated regions 304.

Figure 4:
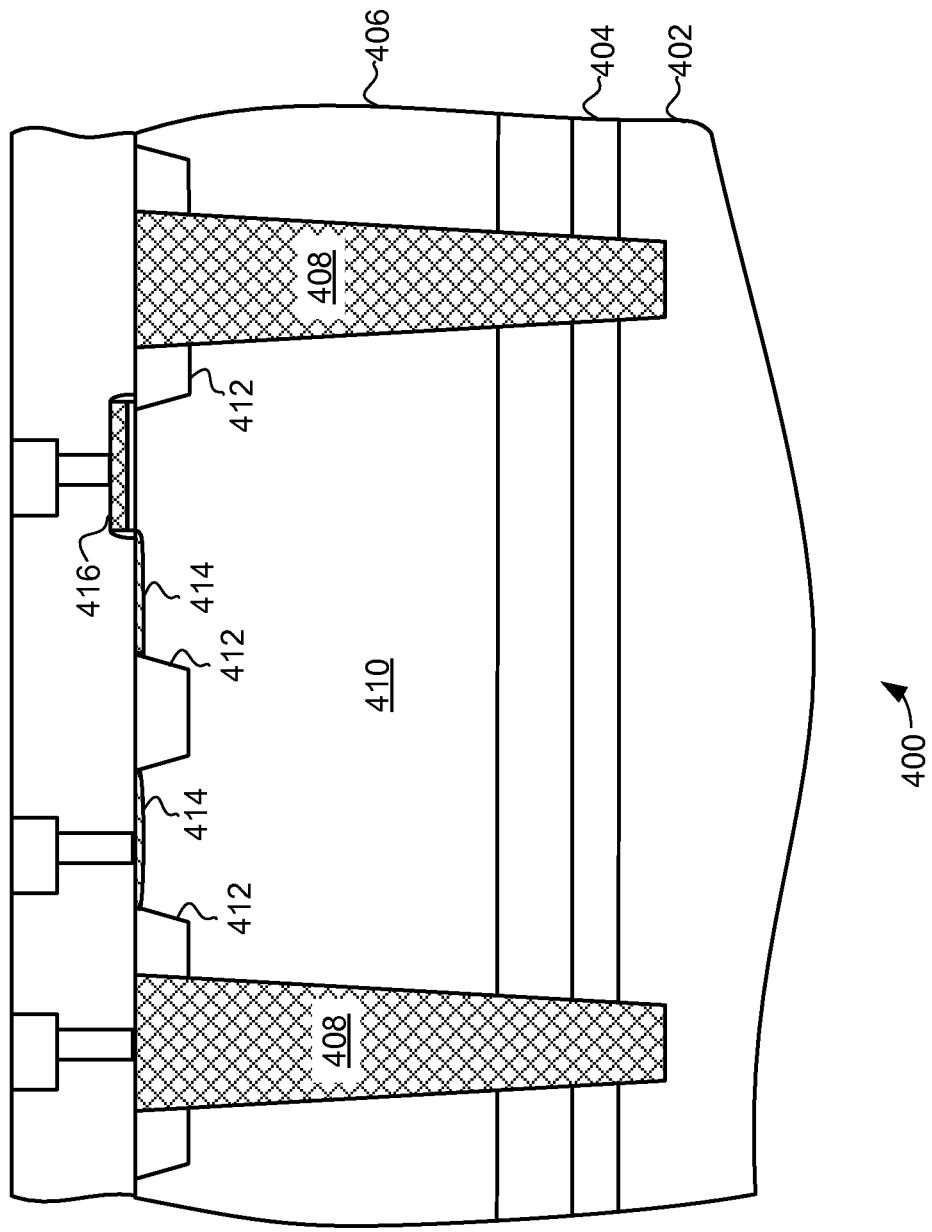
FIG. 4 is a cross-sectional side view of a portion of semiconductor substrate with deep trench isolation structures in accordance with an example embodiment.

Turning now to FIG. 4, a cross-sectional view of a semiconductor device 400 is illustrated. The semiconductor device 400 is exemplary of the type of devices that can be formed and isolated with the deep trench isolation structure layouts described above. The semiconductor device 400 is formed on a SOI substrate 402 that includes a buried oxide (BOX) layer 404. On the SOI substrate is an epitaxial silicon layer 406. In accordance with the embodiments described herein, deep trench isolation structures 408 are formed through the epitaxial silicon layer 406 and through the BOX layer 404 to the underlying substrate 402.

In some embodiments, the deep trench isolation structures 408 are formed by etching the deep trenches and filing the deep trenches with a suitable dielectric, such as silicon dioxide. In other embodiments the deep trench isolation structures 408 can also include a conductor, such as a polysilicon plug configured to provide a ground connection to the substrate 402.

As was described above, the deep trench isolation structures 408 are exemplary of the type of structures that can be formed and utilized to isolate semiconductor devices. Specifically, they are exemplary of the type of structures that can be used to define and surround the various trench-isolated regions described above. And again, in these trench-isolated regions a variety of semiconductor devices can be isolated from other such devices in other trench-isolated regions. In the example illustrated in FIG. 4, the deep trench isolation structures 408 partially define a trench-isolated region 410.

Within the trench-isolated region 410 are various exemplary structures. These structures include shallow trench isolation (STI) regions 412, diffusion regions 414, and gate 416. In the example illustrated in FIG. 4, these structures form part of an antifuse, but this is just one example, and other devices including diodes, transistors, and integrated passive devices may be formed in the various trench-isolated regions.

As was described above, the deep trench isolation structures (e.g., structures 102, 202 and 302) can be used for variety of applications. For example, the deep trench isolation structures can be used to facilitate the formation of large repeating arrays of integrated devices. In such cases the deep trench isolation structures can facilitate the formation of large arrays of devices in relatively compact areas while providing effective isolation between devices.

As one example, such isolation structures can be used in arrays of antifuses. Antifuses and fuses are examples of one-time programmable (OTP) elements that can be used in a variety of semiconductor applications. Antifuses are programmed by creating a short circuit or a low resistance path in a previously open circuit. In one example, arrays of antifuses have been used in read only memories (ROMs) for circuit trimming and other uses. Such applications can include very large arrays of antifuses and thus can typically use significant space on the semiconductor die. Furthermore, in many cases arrays of antifuses can require robust electrical isolation between devices in the array. The embodiments described herein provide deep trench isolation structures that can facilitate the formation of large arrays of devices in relatively compact areas while providing robust isolation between devices.

A typical antifuse element includes an insulating dielectric layer, such as a gate oxide, between two conducting layers. The unprogrammed state of an antifuse element is an open circuit with intact dielectric. Programming an antifuse creates a shorting path at a damaged point, known as the rupture point, in the dielectric/gate oxide formed by applying a voltage and/or current higher than the dielectric rupture voltage and/or current.

Figure 5B:
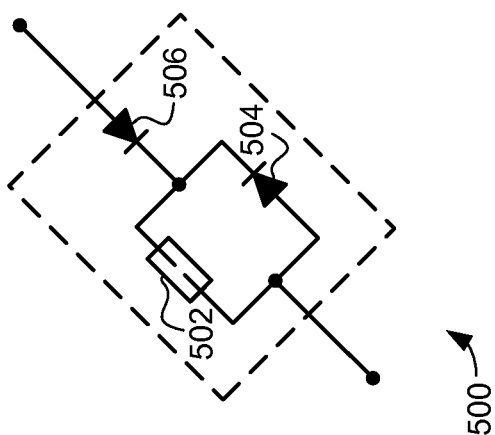
FIGS. 5A and 5B are schematic views of an array of antifuse bitcells in accordance with an example embodiment.
Figure 5A:
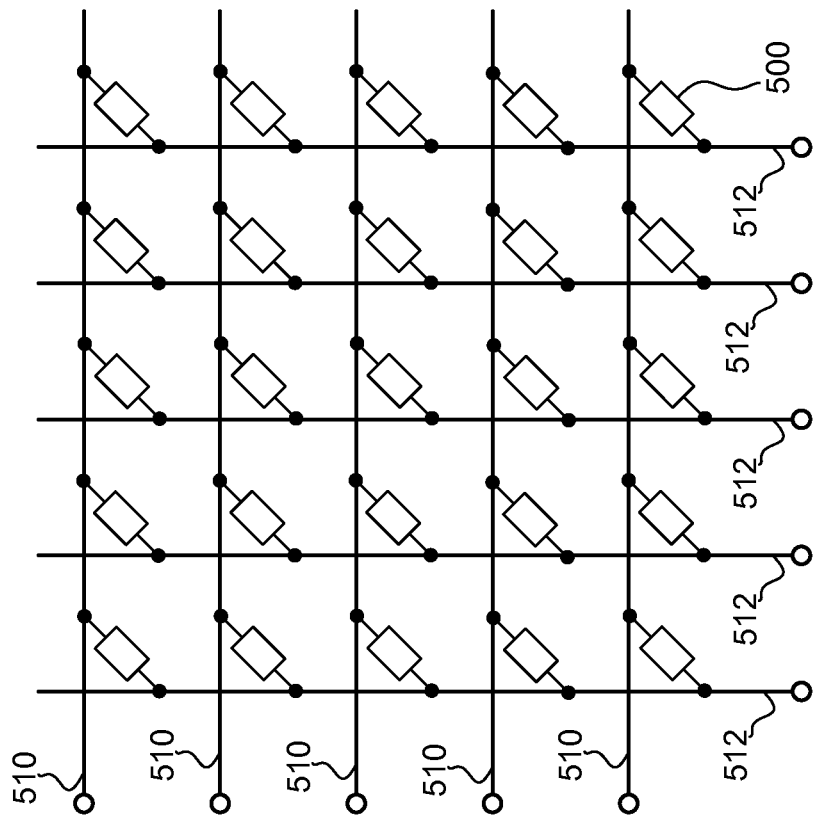
Figure 6:
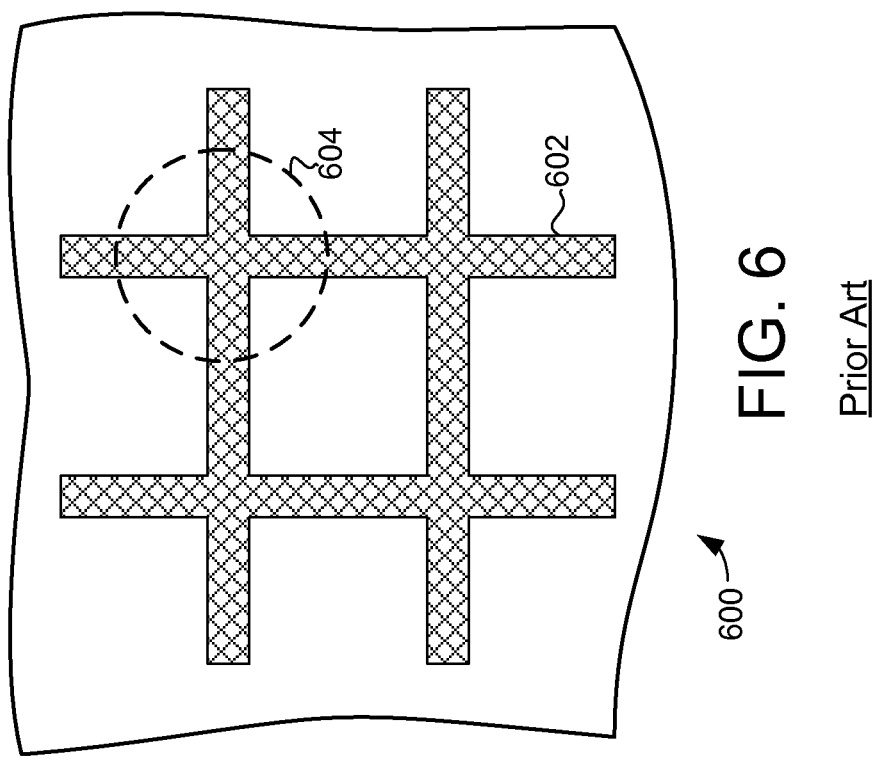
FIG. 6 is a top view of a portion of semiconductor substrate including a deep trench isolation structure.

In some embodiments, each antifuse is arranged in an antifuse bitcell, with each antifuse bitcell including the antifuse itself and one or more diodes. When so configured, each antifuse bitcell may be accessible with row and column drivers such that a large array of antifuses can be used to provide ROM and other similar functions. FIG. 5A illustrates an exemplary bitcell 500, and FIG. 5B illustrates a schematic view of an array 501 of the antifuse bitcells 500. In this illustrated embodiment the array 501 includes 25 antifuse bitcells 500 arranged in 5 rows and 5 columns. Of course, this is just an example and it should be noted that many applications would include much larger arrays of antifuse bitcells 500.

In the illustrated example each antifuse bitcell 500 is coupled to a corresponding row line 510 and a corresponding column line 512. These row lines 510 and column lines 512 can be used to selectively provide programming voltages to individual antifuse bitcells 500 in the array 501. Furthermore, these row lines 510 and column lines 512 can be used to access the antifuse bitcells 500 after programming. For example, to read the antifuse bitcells 500 as a part of a read-only memory array.

The antifuse bitcell 500 comprises an antifuse 502, a first diode 504, and a second diode 506. The first diode 504 is coupled with the antifuse 502 in a parallel combination, and the second diode 506 is coupled in series with the parallel combination of the antifuse 502 and the first diode 504. In such a configuration, the second diode 506 is forward biased during programming to allow the programming current to flow through the antifuse 502 and program the antifuse.

In general, the first diode 504 serves as a bypass diode through which a bypass current can flow and reduce the voltage across the antifuse 502 when other antifuses are being programmed and when small amounts of reverse bias leakage current flow in second diode 506. Specifically, the first diode 504 is forward biased when programming voltages are being applied to certain other antifuses in the array. This forward biasing of the first diode 504 allows current to flow toward the second diode 506. This can prevent excessive voltage from being built up across the antifuse 502 during the programming of these other antifuses. Instead, the voltage across the antifuse 502 during the programming of these other antifuses is limited to the forward biased voltage of the first diode 504, e.g., 0.6 volts in a typical implementation.

When programming the antifuse 502, the first diode 504 is reversed biased compared to the programming voltage across the antifuse 502. Stated another way, the first diode 504 is coupled in antiparallel with the antifuse 502. Because the first diode 504 is reversed biased, only a relatively small amount of leakage current will flow through the first diode 504 during the programming of the antifuse 502, with the vast majority of programming current flowing through the antifuse 502 to facilitate efficient programming.

The second diode 506 is coupled in series with the parallel combination of the antifuse 502 and the first diode 504 and functions as a selector diode. Specifically, the antifuse 502 has a first node and a second node, and the first diode 504 has a first diode anode and a first diode cathode. The first diode 504 is coupled with the antifuse 502 in parallel combination by the first diode cathode being coupled to the first node of the antifuse 502 and the first diode anode being coupled to the second node of the antifuse 502. More details regarding such a bitcell 500 can be found at U.S. Patent Application entitled "ANTIFUSE WITH BYPASS DIODE AND METHOD THEREOF" Ser. No. 14/189,529, filed on Feb. 25, 2014 by John M. Pigott and Randall C. Gray and assigned to Freescale Semiconductor, Inc.

As was noted above, arrays of antifuses can require robust electrical isolation between devices in the array. The embodiments described herein provide deep trench isolation structures that can facilitate the formation of large arrays of antifuse bit cells at relatively high densities while providing robust isolation between devices. Thus, the array 501 of antifuse bitcells 500 is one example of the type of devices that can be implemented using the layout of deep trench isolation structures described above (e.g., structures 102, 202, and 302).

In one specific example, the second diodes 506 are each individually isolated in corresponding first trench-isolated regions 104 while groups of antifuses 502 and first diodes 504 are isolated together in a corresponding second trench-isolated regions 106. Such an arrangement is possible because the anodes of a plurality of individual first diodes 504 and a plurality of the antifuses 502 can be formed and connected together in a common second trench-isolated region 106. Specifically, the antifuses 502 and first diodes 504 corresponding to a column of antifuse bitcells 500 in the array 501 can be formed in one second trench-isolated regions 106, with the anodes of the first diodes 504 and the antifuses 502 coupled together. Such an arrangement can provide high layout density while also providing robust isolation between devices. In another example, the first diodes 504 and corresponding antifuses 502 are placed in individual trench trench-isolated regions 104, while the diodes 506 with common anode connections are combined in groups in trench-isolated regions 106.

The embodiments described herein thus provide a semiconductor device layout and method that can be utilized in a wide variety of semiconductor devices. The layout of the plurality of deep trench isolation structures is such the deep trench isolation structures define and surround a first plurality of first trench-isolated regions in the substrate, and further define a second plurality of second trench-isolated regions in the substrate. The first plurality of first trench-isolated regions is arranged in a plurality of first columns, with each of the first columns including at least two of the first plurality of first trench-isolated regions. Likewise, the plurality of first columns are interleaved with the second trench-isolated regions to alternate in an array such that at least a second trench-isolated region is between consecutive first columns in the array and such that at least two first trench-isolated regions are between consecutive second trench-isolated regions in the array. So arranged the deep trench isolation structures can provide reliable isolation for devices formed within the defined trench-isolated regions. Specifically, the deep trench isolation structures so formed may avoid the formation of a "cross shape" that has been shown to potentially reduce the effectiveness of the isolation provided by the structure.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
   a semiconductor substrate; and
   a plurality of deep trench isolation structures formed in the semiconductor substrate, the plurality of deep trench isolation structures each extending at least to a buried insulator layer in the semiconductor substrate, the plurality of deep trench isolation structures defining and surrounding a first plurality of first trench-isolated regions in the substrate and a second plurality of second trench-isolated regions in the substrate, wherein
      each of the first plurality of first trench-isolated regions has a first dimension along a first direction and each of the second plurality of second trench-isolated regions has a corresponding second dimension along the first direction, and where the second dimension is at least twice the first dimension,
      the first plurality of first trench-isolated regions are arranged in a plurality of first columns, with each of the first columns including at least two of the first plurality of first trench-isolated regions arranged along the first direction, and
      the plurality of first columns are interleaved with the second trench-isolated regions to alternate in an array such that at least one second trench-isolated region is between consecutive first columns in the array, and wherein adjacent of the plurality of first columns and the second trench-isolated regions share common deep trench isolation structures in between, wherein each of first plurality of first trench-isolated regions includes a single semiconductor device formed within and wherein each of the second plurality of second trench-isolated regions includes at least two semiconductor devices formed within.

2. The semiconductor device of claim 1 wherein the single semiconductor device comprises a single diode and wherein the at least two semiconductor devices comprises at least one diode and at least one antifuse.

3. The semiconductor device of claim 1 wherein the plurality of deep trench isolation structures additionally define and surround a third plurality of third trench-isolated regions and a fourth plurality of fourth trench-isolated regions, the third plurality of third trench-isolated regions arranged in a column between columns of the fourth plurality of fourth trench-isolated regions, and wherein the third plurality of third trench-isolated regions are offset from the fourth plurality of fourth trench-isolated regions by an offset distance.

4. The semiconductor device of claim 3 wherein the third plurality of third trench-isolated regions are offset from the fourth plurality of fourth trench-isolated regions in the first direction.

5. The semiconductor device of claim 1 wherein the plurality of first columns are interleaved with the second trench-isolated regions along a second direction, and wherein the second direction is substantially perpendicular to the first direction.

6. The semiconductor device of claim 1 wherein the semiconductor substrate comprises a silicon-on-insulator (SOI) substrate.

7. The semiconductor device of claim 1 wherein each of the plurality of first trench-isolated regions are substantially identical in size.

8. An antifuse array, comprising:
   a semiconductor substrate; and
   a plurality of deep trench isolation structures formed in the semiconductor substrate, the plurality of deep trench isolation structures each extending at least to a buried insulator layer in the semiconductor substrate, the plurality of deep trench isolation structures defining and surrounding a first plurality of first trench-isolated regions in the substrate and a second plurality of second trench-isolated regions in the substrate, wherein
      each of the first plurality of first trench-isolated regions has a first dimension along a first direction and each of the second plurality of second trench-isolated regions has a corresponding second dimension along the first direction, and wherein the second dimension is at least twice the first dimension,
      the first plurality of first trench-isolated regions are arranged in a plurality of first columns, with each of the first columns including at least two of the first plurality of first trench-isolated regions arranged along the first direction,
      the plurality of first columns are interleaved with the second plurality of second trench-isolated regions to alternate in an array such that a second trench-isolated region is between consecutive first columns in the array and such that at least two first trench-isolated regions are between consecutive second trench-isolated regions in the array,
      each of first plurality of first trench-isolated regions includes a single diode formed within, and
      each of the second plurality of second trench-isolated regions includes at least one diode and at least one antifuse formed within.

9. The antifuse array of claim 8 wherein the plurality of deep trench isolation structures additionally define and surround a third plurality of third trench-isolated regions and a fourth plurality of fourth trench-isolated regions, the third plurality of third trench-isolated regions arranged in a column between columns of the fourth plurality of fourth trench-isolated regions, and wherein the third plurality of third trench-isolated regions are offset from the fourth plurality of fourth trench-isolated regions by an offset distance.

10. The antifuse array of claim 8 wherein the semiconductor substrate comprises a silicon-on-insulator (SOI) substrate.

11. The antifuse array of claim 8 wherein each of the plurality of first trench-isolated regions are substantially identical in size.

12. The antifuse array of claim 8 wherein each of the second plurality of second trench-isolated regions includes a plurality of diodes, each of the plurality of diodes having an anode, and wherein the anodes of the plurality of diodes in each second trench-isolated region are coupled together.

13. A method of forming a semiconductor device, the method comprising:
   providing a semiconductor substrate; and
   forming a plurality of deep trench isolation structures in the semiconductor substrate, the plurality of deep trench isolation structures each extending at least to a buried insulator layer in the semiconductor substrate, the plurality of deep trench isolation structures defining and surrounding a first plurality of first trench-isolated regions in the substrate and a second plurality of second trench-isolated regions in the substrate, wherein each of the first plurality of first trench-isolated regions has a first dimension along a first direction and each of the second plurality of second trench-isolated regions has a corresponding second dimension along the first direction, and wherein the second dimension is at least twice the first dimension, the first plurality of first trench-isolated regions are arranged in a plurality of first columns, with each of the first columns including at least two of the first plurality of first trench-isolated regions arranged along the first direction, and wherein the plurality of first columns are interleaved with the second trench-isolated regions to alternate in an array such that a second trench-isolated region is between consecutive first columns in the array and such that at least two first trench-isolated regions are between consecutive second trench-isolated regions in the array, and wherein adjacent of the plurality of first columns and the second trench-isolated regions share common deep trench isolation structures in between; and forming a single semiconductor device in each of first plurality of first trench-isolated regions and forming at least two semiconductor devices in each of the second plurality of second trench-isolated regions.

14. The method of claim 13 wherein the single semiconductor device comprises a single diode and wherein the at least two semiconductor devices comprises at least an anti-fuse and a diode.

15. The method of claim 13 wherein the plurality of deep trench isolation structures additionally define and surround a third plurality of third trench-isolated regions and a fourth plurality of fourth trench isolated regions, the third plurality of third trench-isolated regions arranged in a column between columns of the fourth plurality of fourth trench-isolated regions, and wherein the third plurality of third trench isolated regions are offset in the first direction from the fourth plurality of fourth trench-isolated regions by an offset distance.

16. The method of claim 15 wherein the plurality of first columns are interleaved with the second trench-isolated regions along a second direction, and wherein the second direction is substantially perpendicular to the first direction.

17. The method of claim 13 wherein each of the plurality of first trench-isolated regions are substantially identical in size.

\* \* \* \* \*